(12) United States Patent
Nishimura

(10) Patent No.: US 12,342,685 B2
(45) Date of Patent: Jun. 24, 2025

(54) ELECTRONIC DEVICE

(71) Applicant: Japan Display Inc., Tokyo (JP)

(72) Inventor: Masumi Nishimura, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 425 days.

(21) Appl. No.: 17/846,024

(22) Filed: Jun. 22, 2022

(65) Prior Publication Data

US 2022/0416204 A1 Dec. 29, 2022

(30) Foreign Application Priority Data

Jun. 23, 2021 (JP) ................. 2021-103921

(51) Int. Cl.
| | | |
|---|---|---|
| H01L 51/52 | (2006.01) | |
| H10K 50/844 | (2023.01) | |
| H10K 59/122 | (2023.01) | |
| H10K 59/80 | (2023.01) | |
| H10K 77/10 | (2023.01) | |
| H10K 102/00 | (2023.01) | |

(52) U.S. Cl.
CPC ......... *H10K 59/122* (2023.02); *H10K 50/844* (2023.02); *H10K 59/873* (2023.02); *H10K 59/8731* (2023.02); *H10K 77/111* (2023.02); *H10K 2102/311* (2023.02)

(58) Field of Classification Search
CPC ............... H10K 50/844; H10K 77/111; H10K 2102/311; H10K 59/873; H10K 59/8731; H10K 59/122; H10K 59/35
See application file for complete search history.

(56) References Cited

U.S. PATENT DOCUMENTS

2020/0168670 A1* 5/2020 Kim ................... H10K 59/8723

FOREIGN PATENT DOCUMENTS

JP 2000-195677 A 7/2000

* cited by examiner

*Primary Examiner* — Ermias T Woldegeorgis
(74) *Attorney, Agent, or Firm* — XSENSUS LLP

(57) ABSTRACT

According to one embodiment, an electronic device includes a first bottom electrode, a second bottom electrode, a second insulating layer including a first opening portion overlapping the first bottom electrode and a second opening portion overlapping the second bottom electrode, a first organic layer disposed in the first opening portion, a second organic layer disposed in the second opening portion, a first top electrode covering the first organic layer, a second top electrode covering the second organic layer, and a sealing film covering each of the first top electrode and the second top electrode. A slit which penetrates the sealing film is formed between the first top electrode and the second top electrode.

7 Claims, 7 Drawing Sheets

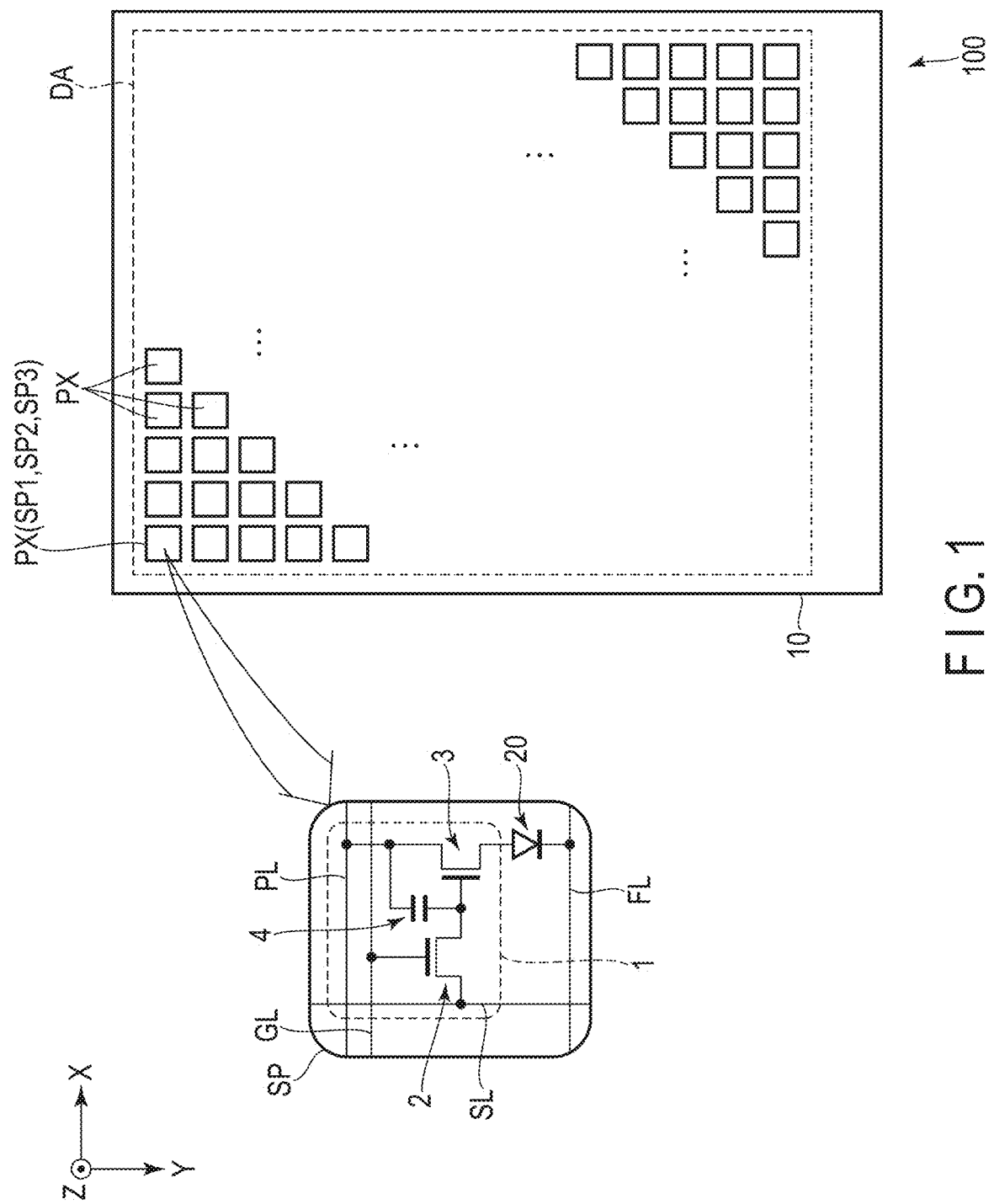
F I G. 1

ELECTRONIC DEVICE

CROSS-REFERENCE TO RELATED APPLICATIONS

This application is based upon and claims the benefit of priority from Japanese Patent Application No. 2021-103921, filed Jun. 23, 2021, the entire contents of which are incorporated herein by reference.

FIELD

Embodiments described herein relate generally to an electronic device.

BACKGROUND

Recently, a display device which applies an organic light emitting diode (OLED) as a display element has been put into practical use. Such a display element comprises an organic layer between a first electrode and a second electrode. For example, the organic layer is formed by a vacuum deposition, and the second electrode is formed by sputtering.

For example, in case of deposition using a mask, a fine mask which comprises an opening corresponding to each pixel is applied. However, the forming accuracy of a thin film formed by vapor deposition may be reduced due to the processing accuracy of the fine mask, the deformation of openings and the like.

To solve this problem, technology which divides the organic layer and the second electrode using a pixel division structure is known.

BRIEF DESCRIPTION OF THE DRAWINGS

FIG. 1 shows a configuration example of an electronic device 100 according to an embodiment.

DETAILED DESCRIPTION

Figure 2:
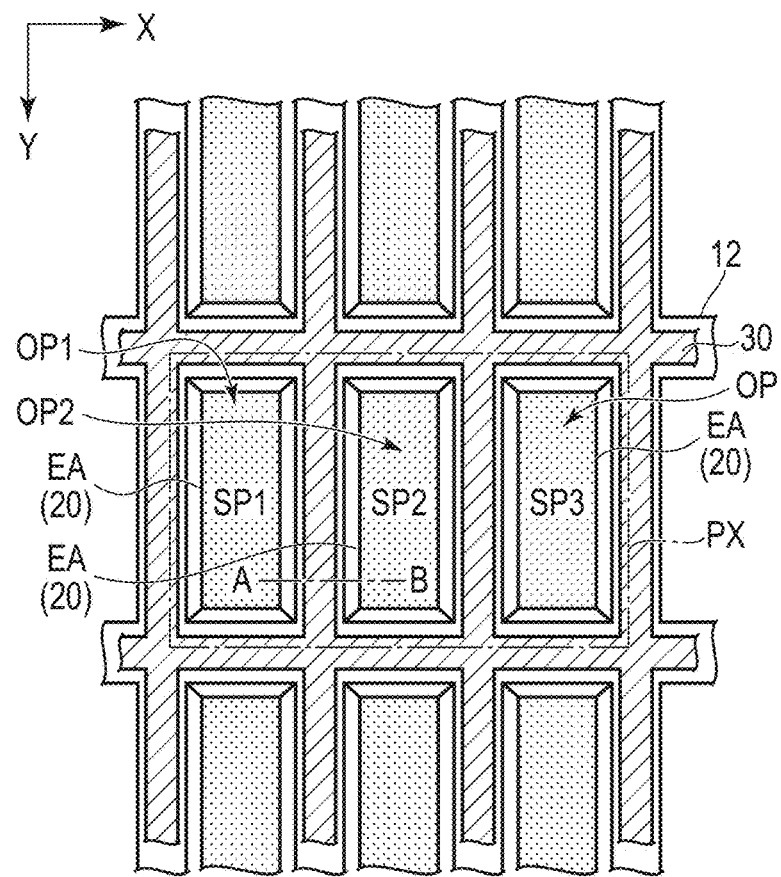
FIG. 2 is a plan view showing an example of each pixel PX shown in FIG. 1.

In general, according to one embodiment, an electronic device comprises a base material, a first insulating layer disposed on the base material, a first bottom electrode disposed on the first insulating layer, a second bottom electrode disposed on the first insulating layer, a second insulating layer disposed on the first insulating layer and comprising a first opening portion overlapping the first bottom electrode and a second opening portion overlapping the second bottom electrode, a first organic layer disposed in the first opening portion and covering the first bottom electrode, a second organic layer disposed in the second opening portion and covering the second bottom electrode, a first top electrode covering the first organic layer, a second top electrode covering the second organic layer, and a sealing film covering each of the first top electrode and the second top electrode. A slit which penetrates the sealing film is formed between the first top electrode and the second top electrode.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective portions are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as an X-direction or a first direction. A direction parallel to the Y-axis is referred to as a Y-direction or a second direction. A direction parallel to the Z-axis is referred to as a Z-direction or a third direction. The plane defined by the X-axis and the Y-axis is referred to as an X-Y plane. When the X-Y plane is viewed, the appearance is defined as a plan view.

According to an embodiment, for example, an electronic device 100 is a display device comprising a display element. The display element is, for example, an organic light emitting diode (OLED) comprising an organic emitting layer. The display element can be applied as a light emitting element of an illumination device. The electronic device 100 may be an illumination device comprising a light emitting element.

The electronic device 100 of the present embodiment may be a sensor device comprising a sensor element. The sensor element is, for example, an organic photodiode (OPD) comprising an organic photoelectric conversion layer.

FIG. 1 shows a configuration example of the electronic device 100 according to the embodiment. The electronic device 100 comprises, on an insulating base material (substrate) 10, a display portion DA which displays an image. The base material 10 may be a glass substrate or a resinous film having flexibility.

The display portion DA comprises a plurality of pixels PX arranged in matrix in a first direction X and a second direction Y. Each pixel PX comprises a plurality of subpixels SP1, SP2 and SP3. For example, each pixel PX comprises a red subpixel SP1, a green subpixel SP2 and a blue subpixel SP3. It should be noted that each pixel PX may comprise four or more subpixels. Specifically, in addition to the above three subpixels, each pixel PX may comprise a subpixel which exhibits another color, or more subpixels which exhibit other colors, such as white. A combination of colors other than the combination of red, green and blue may be applied.

Now, this specification briefly explains a configuration example of a subpixel SP included in a pixel PX.

The subpixel SP comprises a pixel circuit 1, and a display element 20 in which driving is controlled by the pixel circuit 1. The pixel circuit 1 comprises a pixel switch 2, a drive transistor 3 and a capacitor 4. The pixel switch 2 and the drive transistor 3 are, for example, switch elements constituted by thin-film transistors.

Regarding the pixel switch 2, a gate electrode is connected to a scanning line GL, and a source electrode is connected to a signal line SL, and a drain electrode is connected to an electrode of the capacitor 4 and to the gate electrode of the drive transistor 3. Regarding the drive transistor 3, a source electrode is connected to the other electrode of the capacitor 4 and to a power line PL, and a drain electrode is connected to the anode of the display element 20. The cathode of the display element 20 is connected to a feed line FL inside the display portion DA or outside the display portion DA. The configuration of the pixel circuit 1 is not limited to the example shown in the figure.

The display element 20 is an organic light emitting diode (OLED) which is a light emitting element. For example, the subpixel SP1 comprises a display element which emits light corresponding to a red wavelength. The subpixel SP2 comprises a display element which emits light corresponding to a green wavelength. The subpixel SP3 comprises a display element which emits light corresponding to a blue wavelength. Multicolor display can be realized since the pixel PX comprises a plurality of subpixels SP1, SP2 and SP3 having different display colors.

The display elements 20 of the subpixels SP1, SP2 and SP3 may be configured to emit the light of the same color. This configuration enables monochromatic display.

When the display element 20 of each of the subpixels SP1, SP2 and SP3 is configured to emit white light, a color filter facing each display element 20 may be provided. For example, the subpixel SP1 comprises a red color filter facing the display element 20. The subpixel SP2 comprises a green color filter facing the display element 20. The subpixel SP3 comprises a blue color filter facing the display element 20. By this configuration, multicolor display can be realized.

Alternatively, when the display element 20 of each of the subpixels SP1, SP2 and SP3 is configured to emit ultraviolet light, multicolor display can be realized by providing a light conversion layer facing each display element 20.

FIG. 2 is a plan view showing an example of each pixel PX shown in FIG. 1.

Each of the subpixels SP1, SP2 and SP3 which constitute a pixel PX is formed in substantially a rectangular shape extending in the second direction Y. The subpixels SP1, SP2 and SP3 are arranged in the first direction X. The outline of each subpixel corresponds to the outline of an emitting area EA in the display element 20. However, the outline is shown in a simplified manner and does not necessarily reflect the actual shape. Here, it is assumed that the emitting area EA is formed in a rectangular shape having short sides extending in the first direction X and long sides extending in the second direction Y.

As seen in plan view, an insulating layer 12 which is described in detail later is formed in a grating shape extending in the first direction X and the second direction Y, and surrounds each of the subpixels SP1, SP2 and SP3 or the display element 20 of each subpixel. Such an insulating layer 12 may be referred to as a rib, partition, bank and the like. The insulating layer 12 comprises a plurality of opening portions OP including opening portions OP1 and OP2. The emitting areas EA are formed in the opening portions OP of the insulating layer 12. The opening portions OP are arranged in matrix in the first direction X and the second direction Y.

As seen in plan view, a partition 30 which is described in detail later is formed in a grating shape extending in the first direction X and the second direction Y and is disposed on the insulating layer 12. Each of the subpixels SP1, SP2 and SP3 is surrounded by the partition 30.

The shape of the partition 30 is not limited to the example shown in FIG. 2, and may be another shape such as a stripe shape. The layout of the subpixels SP or opening portions OP is not limited to the example shown in FIG. 2, either.

Figure 3:
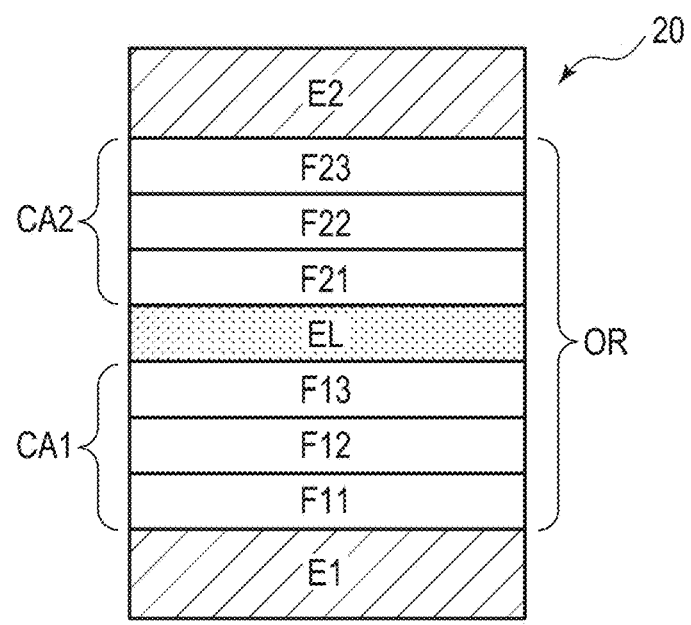
FIG. 3 shows an example of the configuration of a display element 20.

FIG. 3 shows an example of the configuration of the display element 20.

The display element 20 comprises a bottom electrode (first electrode) E1, an organic layer OR and a top electrode (second electrode) E2. The organic layer OR is disposed on the bottom electrode E1. The top electrode E2 is disposed on the organic layer OR. The organic layer OR comprises a carrier adjustment layer CA1, a light emitting layer EL and a carrier adjustment layer CA2. The carrier adjustment layer CA1 is located between the bottom electrode E1 and the light emitting layer EL. The carrier adjustment layer CA2 is located between the light emitting layer EL and the top electrode E2. The carrier adjustment layers CA1 and CA2 include a plurality of functional layers.

Here, this specification explains an example in which the bottom electrode E1 corresponds to an anode and the top electrode E2 corresponds to a cathode.

The carrier adjustment layer CA1 includes a hole injection layer F11, a hole transport layer F12, an electron blocking layer F13 and the like as functional layers. The hole injection layer F11 is disposed on the bottom electrode E1. The hole transport layer F12 is disposed on the hole injection layer F11. The electron blocking layer F13 is disposed on the hole transport layer F12. The light emitting layer EL is disposed on the electron blocking layer F13.

The carrier adjustment layer CA2 includes a hole blocking layer F21, an electron transport layer F22, an electron injection layer F23 and the like as functional layers. The hole blocking layer F21 is disposed on the light emitting layer EL. The electron transport layer F22 is disposed on the hole blocking layer F21. The electron injection layer F23 is disposed on the electron transport layer F22. The top electrode E2 is disposed on the electron injection layer F23.

In addition to the functional layers described above, the carrier adjustment layers CA1 and CA2 may include other functional layers such as a carrier generation layer as needed, or at least one of the above functional layers may be omitted in the carrier adjustment layers CA1 and CA2.

Figure 4:
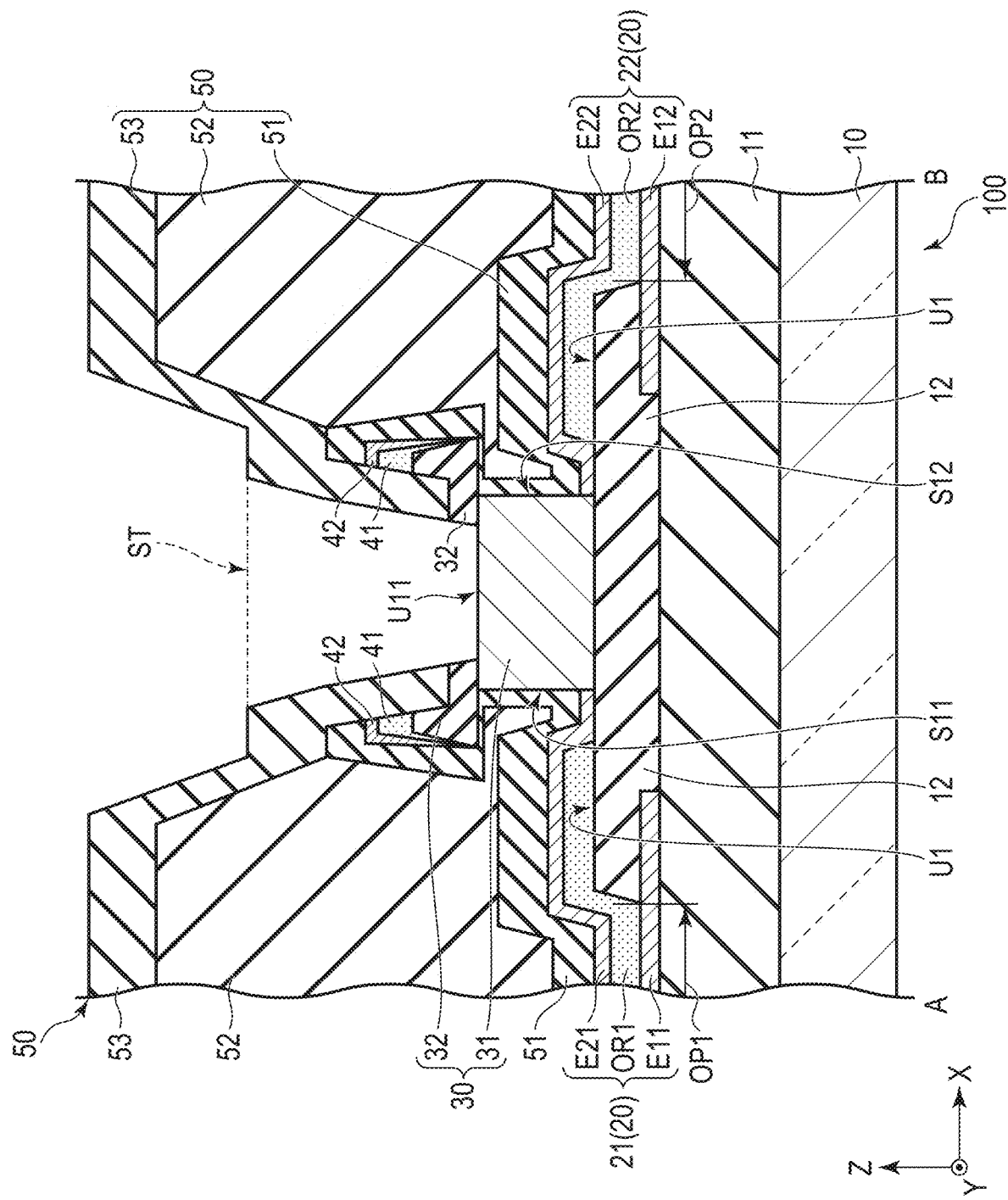
FIG. 4 is a cross-sectional view showing a configuration example of the electronic device 100 along the A-B line shown in FIG. 2.

FIG. 4 is a cross-sectional view showing a configuration example of the electronic device 100 along the A-B line shown in FIG. 2.

The electronic device 100 comprises the base material 10, an insulating layer (first insulating layer) 11, the insulating layer (second insulating layer) 12, the display element 20, the partition 30 and a sealing film 50.

From the viewpoint of providing the flexible electronic device 100, the base material 10 is a resinous film. The insulating layer 11 is disposed on the base material 10 and corresponds to an underlayer of the display element 20. The pixel circuit 1 shown in FIG. 1 is disposed on the base material 10 and is covered with the insulating layer 11. The insulating layer 12 is disposed on the insulating layer 11.

We now focus on two display elements adjacent to each other in the first direction X. For convenience, the display element located on the left side of the figure is denoted as a display element 21, and the display element located on the right side of the figure is denoted as a display element 22.

The display element 21 comprises a bottom electrode (first bottom electrode) E11, an organic layer (first organic layer) OR1 and a top electrode (first top electrode) E21.

The display element 22 comprises a bottom electrode (second bottom electrode) E12, an organic layer (second organic layer) OR2 and a top electrode (second top electrode) E22.

The bottom electrodes E11 and E12 are disposed on the insulating layer 11, and are arranged so as to be spaced apart from each other in the first direction X. Each of the bottom electrodes E11 and E12 is an electrode arranged for each subpixel or each display element, and is electrically connected to the drive transistor 3 shown in FIG. 1. These bottom electrodes E11 and E12 may be referred to as pixel electrodes, anodes, etc.

The bottom electrodes E11 and E12 are transparent electrodes formed of, for example, a transparent conductive material such as indium tin oxide (ITO) or indium zinc oxide (IZO). The bottom electrodes E11 and E12 may be metal electrodes formed of a metal material such as silver or aluminum. Alternatively, the bottom electrodes E11 and E12 may be stacked layer bodies of transparent electrodes and metal electrodes. For example, the bottom electrodes E11 and E12 may be configured as stacked layer bodies formed by stacking a transparent electrode, a metal electrode and a transparent electrode in order, or may be configured as stacked layer bodies of four or more layers.

The insulating layer 12 is disposed between the bottom electrode E11 and the bottom electrode E12. The insulating layer 12 comprises the opening portion OP1 and the opening portion OP2. The insulating layer 12 is formed so as to define the subpixels or display elements 21 and 22. The insulating layer 12 is, for example, an inorganic insulating layer formed of a silicon nitride and the like.

The opening portion OP1 is formed in an area overlapping the bottom electrode E11, and is a through-hole which penetrates the insulating layer 12 such that the bottom electrode E11 is exposed from the insulating layer 12. The peripheral portion of the bottom electrode E11 is covered with the insulating layer 12. The central portion of the bottom electrode E11 is exposed from the insulating layer 12 in the opening portion OP1.

The opening portion OP2 is formed in an area overlapping the bottom electrode E12, and is a through-hole which penetrates the insulating layer 12 such that the bottom electrode E12 is exposed from the insulating layer 12. The peripheral portion of the bottom electrode E12 is covered with the insulating layer 12. The central portion of the bottom electrode E12 is exposed from the insulating layer 12 in the opening portion OP2.

The organic layer OR1 is disposed in the opening portion OP1 and covers the bottom electrode E11. The organic layer OR2 is disposed in the opening portion OP2 and covers the bottom electrode E12. In the example shown in FIG. 4, a part of the organic layer OR1 and a part of the organic layer OR2 are also disposed on the top surface U1 of the insulating layer 12. Each of these organic layers OR1 and OR2 is arranged for a subpixel or display element in a manner similar to that of the bottom electrodes E11 and E12. On the insulating layer 12, the organic layer OR2 is spaced apart from the organic layer OR1.

Each of the organic layers OR1 and OR2 includes a light emitting layer. The light emitting layer of the organic layer OR1 may be formed of the same material as the light emitting layer of the organic layer OR2 (in other words, the organic layer OR1 and the organic layer OR2 may have the same light emission color). Or, the light emitting layer of the organic layer OR1 may be formed of a material different from that of the light emitting layer of the organic layer OR2 (in other words, the organic layer OR1 and the organic layer OR2 may have light emission colors different from each other).

The top electrode E21 is disposed on the organic layer OR1 and covers the entire part of the organic layer OR1 including the peripheral portion of the organic layer OR1. The top electrode E21 is in contact with the top surface U1 outside the peripheral portion of the organic layer OR1. Of the organic layer OR1, a portion located between the bottom electrode E11 and the top electrode E21 without intervention of the insulating layer 12 is configured to form an emitting area of the display element 21. Of the organic layer OR1, a portion located between the insulating layer 12 and the top electrode E21 hardly emits light.

The top electrode E22 is disposed on the organic layer OR2 and covers the entire part of the organic layer OR2 including the peripheral portion of the organic layer OR2. The top electrode E22 is in contact with the top surface U1 outside the organic layer OR2. The top electrode E22 is spaced apart from the top electrode E21. Of the organic layer OR2, a portion located between the bottom electrode E12 and the top electrode E22 without intervention of the insulating layer 12 is configured to form an emitting area of the display element 22. Of the organic layer OR2, a portion located between the insulating layer 12 and the top electrode E22 hardly emits light.

Each of these top electrodes E21 and E22 is an electrode arranged for a subpixel or display element. As described later, the top electrodes E21 and E22 are electrically connected to each other through the partition 30. These top electrodes E21 and E22 may be referred to as common electrodes, counter-electrodes, cathodes, etc.

The top electrodes E21 and E22 are, for example, semi-transparent metal electrodes formed of a metal material such as magnesium or silver. The top electrodes E21 and E22 may be transparent electrodes formed of a transparent conductive material such as ITO or IZO. Alternatively, the top electrodes E21 and E22 may be stacked layer bodies of transparent electrodes and metal electrodes.

The partition 30 is located between the display element 21 and the display element 22, and is disposed on the insulating layer 12. On the top surface U1, the partition 30 is located between the organic layer OR1 and the organic layer OR2, and is spaced apart from the organic layers OR1 and OR2. The partition 30 is located between the top electrode E21 and the top electrode E22, and is in contact with the top electrodes E21 and E22.

The partition 30 comprises a first layer 31 and a second layer 32 disposed on the first layer 31.

The first layer 31 is, for example, a conductive layer formed of a metal material. The first layer 31 is located on the insulating layer 12 and is in contact with the top surface U1. The first layer 31 comprises a side surface (first side surface) S11 facing the opening portion OP1 (or the display element 21), a side surface (second side surface) S12 facing the opening portion OP2 (or the display element 22), and a top surface U11 between the side surface S11 and the side surface S12. The top electrode E21 is in contact with the side surface S11, and the top electrode E22 is in contact with the side surface S12. By this configuration, the top electrodes E21 and E22 which are adjacent to each other across the intervening partition 30 are electrically connected to each other. In other words, the first layer 31 functions as the feed line FL shown in FIG. 1. Apart from the first layer 31, a feed line FL may be provided in the display portion DA and electrically connected to the top electrode of each display element.

The second layer 32 is formed of a material different from that of the first layer 31, and is formed of, for example, an insulating material. For example, the second layer 32 is an inorganic insulating layer formed of a silicon nitride, etc., which is the same material as the insulating layer 12. The second layer 32 is in contact with the top surface U11. The second layer 32 extends from the side surface S11 toward the opening portion OP1 on the left side of the figure, and further extends from the side surface S12 toward the opening portion OP2 on the right side of the figure.

On the partition 30, as deposits, a layer 41 formed of the same material as the organic layer OR1 and a layer 42 formed of the same material as the top electrode E21 are stacked. The layer 41 is spaced apart from the organic layers OR1 and OR2. The layer 42 is spaced apart from the top electrodes E21 and E22.

As this partition 30 is formed, the organic layers OR1 and OR2 and the top electrodes E21 and E22 are formed without applying a fine mask.

In other words, the organic layers OR1 and OR2 are formed by, for example, a vacuum deposition method, using the partition 30 as a mask. At this time, vapor from an evaporation source passes through the area where the partition 30 does not exist, and reaches the upper side of the bottom electrodes E11 and E12. Vapor from the evaporation source does not reach the shadow area of the partition 30.

Similarly, the top electrodes E21 and E22 are formed by, for example, sputtering, using the partition 30 as a mask. At this time, particles from a target passes through the area where the partition 30 does not exist, and reaches the upper side of the organic layers OR1 and OR2.

This configuration reduces the production cost compared to the case where a fine mask is applied, and also eliminates the need for processes such as fine mask alignment. Thus, the organic layers OR1 and OR2 and the top electrodes E21 and E22 can be easily formed in a desired shape. In addition, in the display elements 21 and 22, an emitting area can be formed in a predetermined area. Furthermore, undesired light emission in an area overlapping the insulating layer 12 is suppressed.

The sealing film 50 for protecting the display elements 21 and 22 from moisture, etc., covers the top electrodes E21 and E22. In this sealing film 50, a slit ST is formed so as to penetrate the sealing film 50 between the top electrode E21 and the top electrode E22. In the example shown in FIG. 4, the slit ST also penetrates the second layer 32 of the partition 30, and the top surface U11 of the first layer 31 is exposed from the slit ST.

Now, the sealing film 50 is described more specifically.

The sealing film 50 comprises an inorganic insulating film (first inorganic insulating film) 51, an organic insulating film 52 and an inorganic insulating film (second inorganic insulating film) 53. The organic insulating film 52 is disposed on the inorganic insulating film 51 and covered with the inorganic insulating film 53.

The inorganic insulating film 51 is divided by the slit ST and covers the top electrodes E21 and E22 individually. In other words, on the left side of the figure, the inorganic insulating film 51 is in contact with the top electrode E21 and the side surface S11 of the first layer 31, and overlaps the second layer 32 and the layers 41 and 42. On the right side of the figure, the inorganic insulating film 51 is in contact with the top electrode E22 and the side surface S12 of the first layer 31, and overlaps the second layer 32 and the layers 41 and 42. The inorganic insulating film 51 is formed of, for example, a transparent insulating material such as a silicon nitride.

The organic insulating film 52 is also divided by the slit ST and is disposed on each of the inorganic insulating film 51 covering the top electrode E21 and the inorganic insulating film 51 covering the top electrode E22. On the left side of the figure, the organic insulating film 52 overlaps the top electrode E21 and is in contact with the inorganic insulating film 51. On the right side of the figure, the organic insulating film 52 overlaps the top electrode E22 and is in contact with the inorganic insulating film 51. The organic insulating film 52 is formed of, for example, a transparent resinous material such as an acrylic resin.

The inorganic insulating film 53 is also divided by the slit ST and covers each of the organic insulating film 52 overlapping the top electrode E21 and the organic insulating film 52 overlapping the top electrode E22. On the left side of the figure, the inorganic insulating film 53 overlaps the top electrode E21, and is in contact with the organic insulating film 52, and is in contact with the inorganic insulating film 51 on the partition 30. On the right side of the figure, the inorganic insulating film 53 overlaps the top electrode E22, and is in contact with the organic insulating film 52, and is in contact with the inorganic insulating film 51 on the partition 30. The inorganic insulating film 53 is formed of, for example, the same material as the inorganic insulating film 51, and is formed of a transparent insulating material such as a silicon nitride.

As explained above, the electronic device 100 can be provided so as to be flexible by forming the slit ST which penetrates the sealing film 50 and dividing the sealing film 50 for each display element. In addition, compared to the case where the slit ST is not formed in the sealing film 50, it is possible to reduce damage to the sealing film 50 when the electronic device 100 is deformed. Thus, predetermined sealing performance can be maintained.

Figure 5:
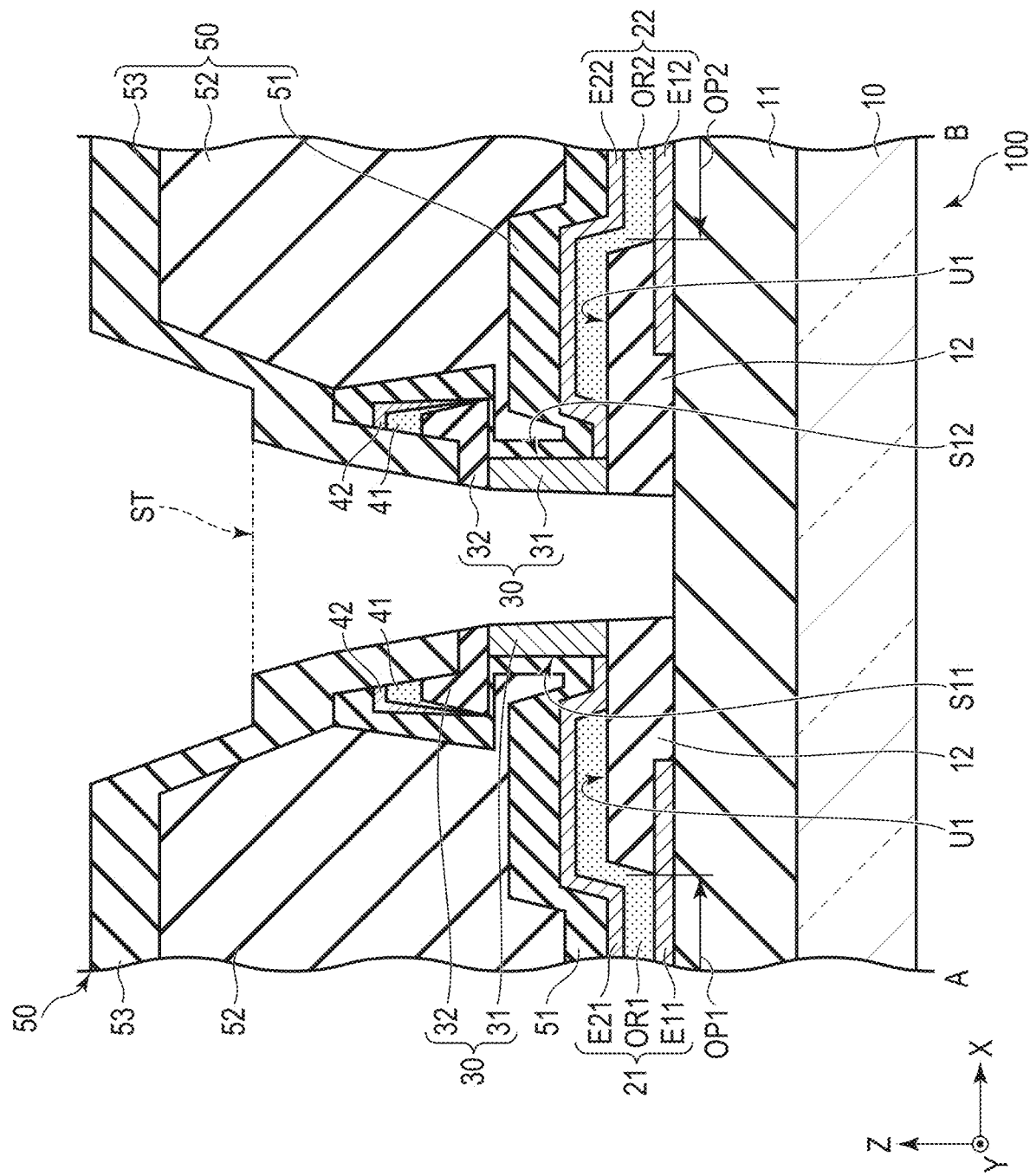
FIG. 5 is a cross-sectional view showing another configuration example of the electronic device 100 along the A-B line shown in FIG. 2.

FIG. 5 is a cross-sectional view showing another configuration example of the electronic device 100 along the A-B line shown in FIG. 2.

The configuration example shown in FIG. 5 is different from the configuration example shown in FIG. 4 in respect that the slit ST further penetrates the first layer 31 and the insulating layer 12. In other words, the insulating layer 12 and the partition 30 are divided by the slit ST. In the example shown in the figure, the insulating layer 11 is exposed from the slit ST.

In this configuration example, since the first layer 31 which is a conductive layer and the insulating layer 12 which is an inorganic insulating layer are divided by the slit ST, it is possible to provide the electronic device 100 so as to be more flexible than the configuration example shown in FIG. 4. Although not shown in the figure, the slit ST may be configured to include a recess portion which penetrates the sealing film 50 and does not penetrate the first layer 31, or may be configured to include a recess portion which penetrates the sealing film 50 and the first layer 31 and does not penetrate the insulating layer 12.

Figure 6:
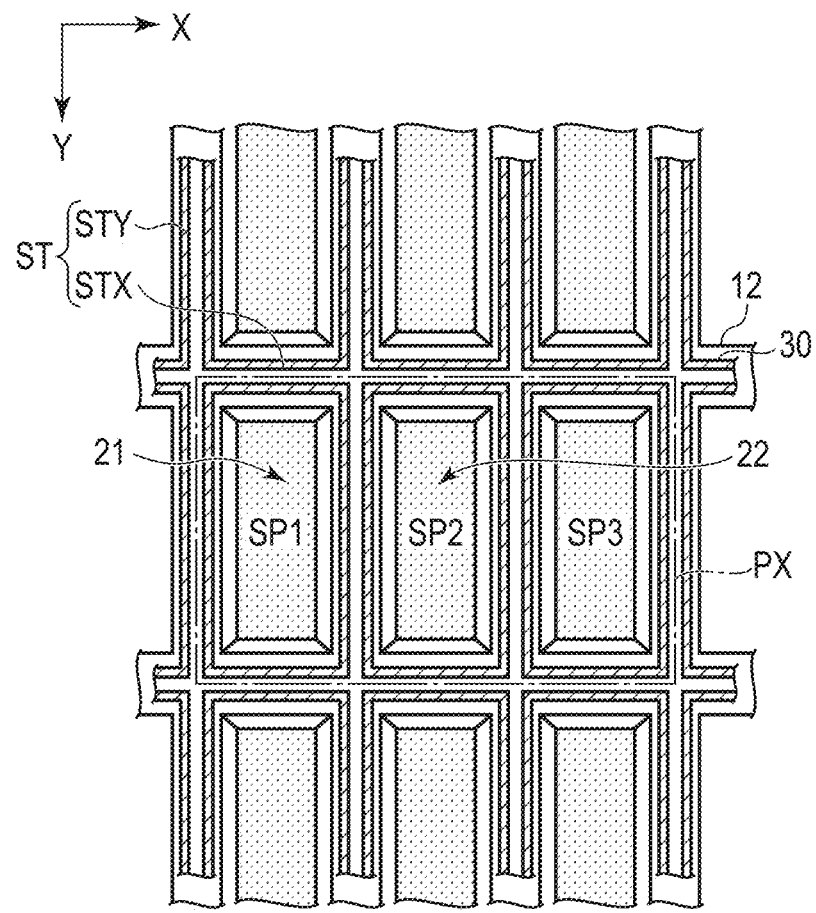
FIG. 6 is a plan view showing a configuration example of a slit ST.

FIG. 6 is a plan view showing a configuration example of the slit ST.

The slit ST comprises a first portion STX extending in the first direction X parallel to the insulating layer 12, and a second portion STY extending in the second direction Y parallel to the insulating layer 12. The slit ST is formed in a grating shape.

Figure 7:
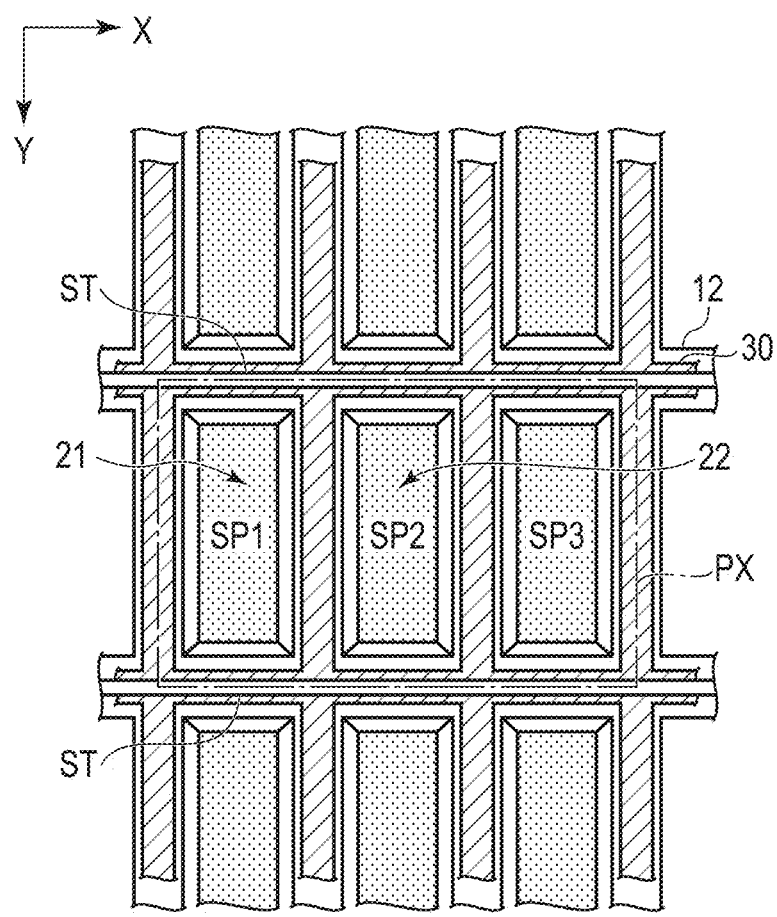
FIG. 7 is a plan view showing another configuration example of the slit ST.

FIG. 7 is a plan view showing another configuration example of the slit ST.

The slit ST extends in the first direction X parallel to the insulating layer 12 and is formed in a stripe shape.

Figure 8:
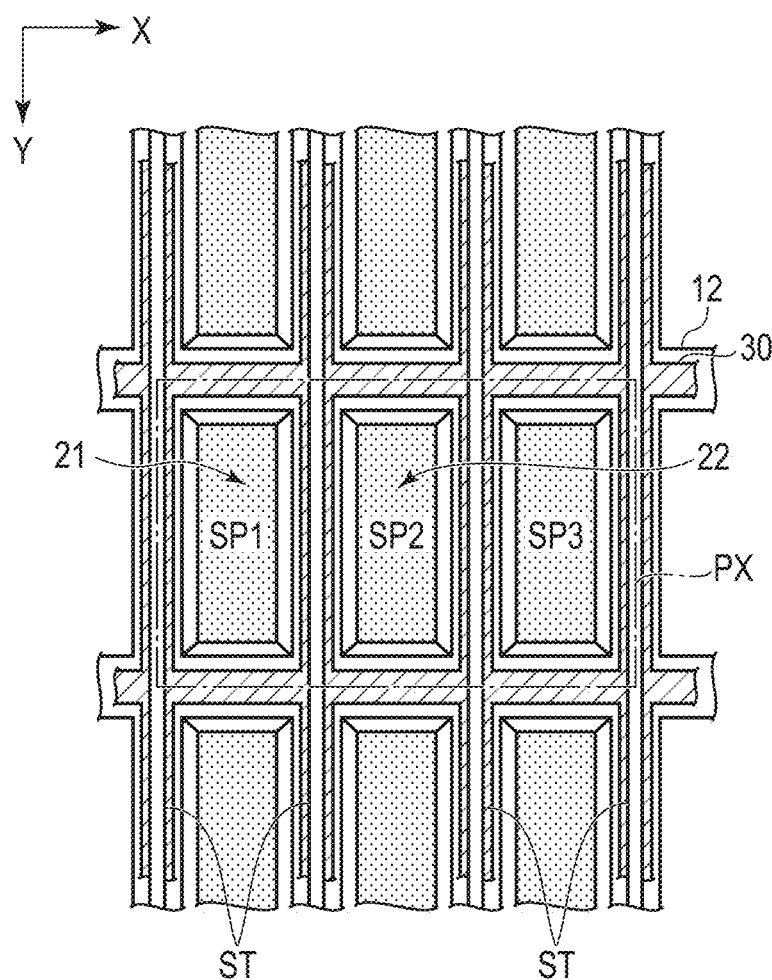
FIG. 8 is a plan view showing another configuration example of the slit ST.

FIG. 8 is a plan view showing another configuration example of the slit ST.

The slit ST extends in the second direction Y parallel to the insulating layer 12 and is formed in a stripe shape.

In each of the configuration examples shown in FIG. 6 to FIG. 8, the slit ST penetrates at least the sealing film 50. The slit ST may penetrate the second layer 32 as shown in FIG. 4, or may penetrate the insulating layer 12, the first layer 31 and the second layer 32 as shown in FIG. 5. The shape of the slit ST is not limited to a continuous straight line, and may be a dotted line.

According to the above embodiment, a flexible electronic device can be provided.

All of the electronic devices that can be implemented by a person of ordinary skill in the art through arbitrary design changes to the electronic device described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. An electronic device comprising:
   a base material;
   a first insulating layer disposed on the base material;
   a first bottom electrode disposed on the first insulating layer and a second bottom electrode disposed on the first insulating layer;
   a second insulating layer disposed on the first insulating layer, and comprising a first opening portion overlapping the first bottom electrode and a second opening portion overlapping the second bottom electrode;
   a partition disposed on the second insulating layer;
   a first organic layer disposed in the first opening portion and covering the first bottom electrode;
   a second organic layer disposed in the second opening portion and covering the second bottom electrode;
   a first top electrode covering the first organic layer;
   a second top electrode covering the second organic layer; and
   a sealing film covering each of the first top electrode and the second top electrode, wherein
   a slit which penetrates the sealing film is formed between the first top electrode and the second top electrode,
   the sealing film comprises:
   a first inorganic insulating film which covers each of the first top electrode and the second top electrode and is divided by the slit;
   an organic insulating film disposed on each of the first inorganic insulating film covering the first top electrode and the first inorganic insulating film covering the second top electrode; and
   a second inorganic insulating film which covers each of the organic insulating film overlapping the first top electrode and the organic insulating film overlapping the second top electrode,
   the partition comprises:
   a first layer formed of a metal material, and comprising a first side surface which is in contact with the first top electrode and a second side surface which is in contact with the second top electrode; and
   a second layer disposed on the first layer, extending from the first side surface toward the first opening portion, and extending from the second side surface toward the second opening portion, and
   the slit penetrates the second layer.

2. The electronic device of claim 1, wherein the first inorganic insulating film is formed of a same material as the second inorganic insulating film.

3. The electronic device of claim 1, wherein the second layer is an inorganic insulating layer formed of a same material as the second insulating layer.

4. The electronic device of claim 1, wherein the first inorganic insulating film and the second inorganic insulating film are in contact with each other on the partition.

5. The electronic device of claim 1, wherein the slit further penetrates the first layer and the second insulating layer.

6. The electronic device of claim 1, wherein the slit is formed in a stripe shape or grating shape.

7. The electronic device of claim 1, wherein the base material is a resinous film.

* * * * *